United States Patent [19]

Lai

[11] Patent Number: 5,188,980
[45] Date of Patent: Feb. 23, 1993

[54] INERT GAS PURGE FOR THE MULTILAYER POLY GATE ETCHING IMPROVEMENT

[75] Inventor: Ming C. Lai, Hsin-Chu, Taiwan

[73] Assignee: United Microelectronics Corporation, Hsinchu, Taiwan

[21] Appl. No.: 908,381

[22] Filed: Jul. 6, 1992

[51] Int. Cl.$^5$ .................................... H01L 21/308
[52] U.S. Cl. .................................... 437/193; 437/200; 437/228; 156/643; 156/646; 156/653; 156/657; 156/659.1
[58] Field of Search ............ 437/193, 200, 228; 156/643, 646, 653, 657, 659.1

[56] References Cited

U.S. PATENT DOCUMENTS

| | | | |
|---|---|---|---|
| 4,680,086 | 7/1987 | Thomas et al. | 156/643 |
| 4,778,563 | 10/1988 | Stone | 156/643 |
| 4,786,360 | 1/1988 | Cote et al. | 156/643 |
| 4,818,334 | 4/1989 | Shwartzman et al. | 156/643 |
| 4,844,767 | 7/1989 | Okudaira et al. | 156/345 |
| 4,948,462 | 8/1990 | Rossen | 156/643 |
| 4,980,018 | 12/1990 | Mu et al. | 156/643 |
| 5,110,408 | 5/1992 | Fujii et al. | 156/643 |
| 5,110,411 | 5/1992 | Long | 156/656 |

OTHER PUBLICATIONS

Roth, S. S. et al., "Polycide reactive ion etch . . . ," J. Vac. Sci. Technol.B, vol. 7, No. 3, May/Jun. 1989, pp. 551-555.

Fischl, D. S. et al., "Plasma-Enhanced Etching . . . ", J. Electrochem. Soc., vol. 134, No. 9, Sep. 1987, pp. 2265-2269.

Hess, D. W., "Tungsten and Tungsten Silicide Etching . . . ," Solid State Technology, Apr. 1988, pp. 97-103.

Sze, S. M., VLSI Technology, McGraw-Hill, Second Edition, 1988, pp. 200-204.

Primary Examiner—T. N. Quach
Attorney, Agent, or Firm—George O. Saile

[57] ABSTRACT

A process for dry etching a multilayer tungsten silicide or other metal silicide polysilicon gate structure of an integrated circuit is achieved. A mixture of chlorine and helium gases is flowed into a vacuum chamber and a radio frequency is applied for etching the silicide layer. The chlorine gas flow is stopped after the etching of the tungsten silicide is completed and the vacuum chamber is purged with helium. The chlorine and helium gas flow is resumed to complete the etching of the polysilicon multilayer portion with a mixture of chlorine and helium gases. No undercutting of the tungsten silicide is experienced using this process.

19 Claims, 2 Drawing Sheets

INERT GAS PURGE FOR THE MULTILAYER POLY GATE ETCHING IMPROVEMENT

BACKGROUND OF THE INVENTION (1) Field of the Invention

The invention relates to a process for dry etching multilayer structures, and more particularly, to a process for dry etching a multilayer tungsten silicide polysilicon gate structure in the manufacture of integrated circuits.

(2) Description of the Prior Art

Dry etching, as defined by Thomas et al in his U.S. Pat. No. 4,680,086, is process in which a gas or a plasma containing at least one reactive specie and which is energized by a radio frequency when placed in contact with a structure to be etched, causes a reaction at the surface of the metal wherein the reacted material is removed in the form of a gas. A common problem with dry etching is the undercutting of the polysilicon gate layer.

For example, U.S. Pat. Nos. 4,680,086 to Thomas et al, 4,786,360 to Cote et al, 4,948,462 to Rossen, and 4,844,767 to Okudaira et al describe the use of various chlorine and fluorine gases to etch the polysilicon gate layer, especially tungsten, to prevent the undercutting problem. U.S. Pat. No. 4,980,018 to Mu et al uses chlorine and helium gases to pattern tungsten after using forms of fluorine and chlorine gases. The above cited US Patent to Okudaira et al mentions the protective sidewall coating that develops during etching to protect against undercutting. Sidewall passivation effect during etching is described by S. M. Sze in his book, *VLSI Technology*, Second Edition, McGraw-Hill International Editions, New York, NY c.1988, p.200.

SUMMARY OF THE INVENTION

A principal object of the present invention is to provide an effective and very manufacturable process for dry etching a multilayer tungsten silicide polysilicon gate structure of an integrated circuit.

Another object of the present invention is to provide a process for dry etching a multilayer tungsten silicide polysilicon gate structure of an integrated circuit so that there is no undercutting of the metal silicide layer.

In accordance with the objects of this invention a new process for dry etching a multilayer tungsten silicide polysilicon gate structure of an integrated circuit is achieved. A mixture of chlorine and helium gases is flowed into a vacuum chamber and a radio frequency is applied. The chlorine gas flow is stopped after the etching of the tungsten silicide is completed and the vacuum chamber is purged with helium. The chlorine and helium gas flow is resumed to complete the etching of the polysilicon multilayer portion with a mixture of chlorine and helium gases. No undercutting of the tungsten silicde is experienced using this process.

BRIEF DESCRIPTION OF THE DRAWINGS

In the accompanying drawings forming a material part of this description, there is shown.

DESCRIPTION OF THE PREFERRED EMBODIMENTS

Figure 1:
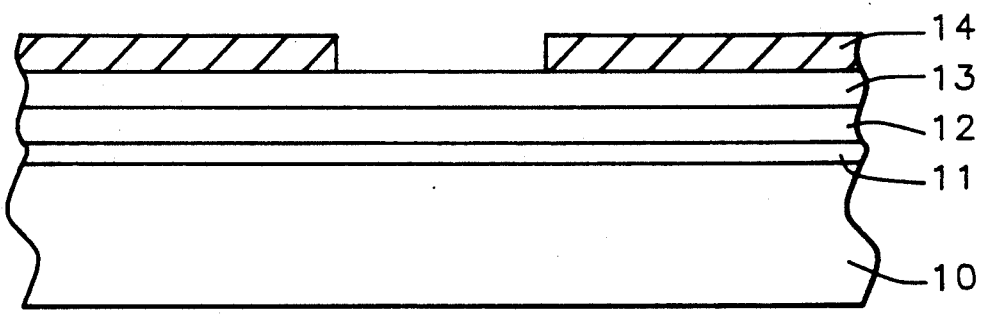
FIGS. 1 through 3 schematically illustrate in cross-sectional representation one preferred embodiment of this invention.

Referring now more particularly to FIG. 1, there is shown an illustration of a partially completed integrated circuit. A substrate 10, composed of monocrystalline silicon forms the basis of the structure. A thin silicon oxide layer 11 overlays substrate 10. This layer 11 may have a thickness of between 100 to 250 Angstroms. Overlaying the dielectric layer 11 is a polysilicon layer 12 which may be composed of silicon doped with phosphorus having a thickness of between 1500 to 2500 Angstroms. Overlaying 12 is a tungsten silicide layer 13 forming a multilayer polysilicon gate structure. The silicide layer 13 has a thickness of between 1500 to 2500 Angstroms and may be formed by the process of silane gas deposition. Layer 14 is a patterned photoresist layer which will be used to create a pattern in the underlying layers.

Figure 5:
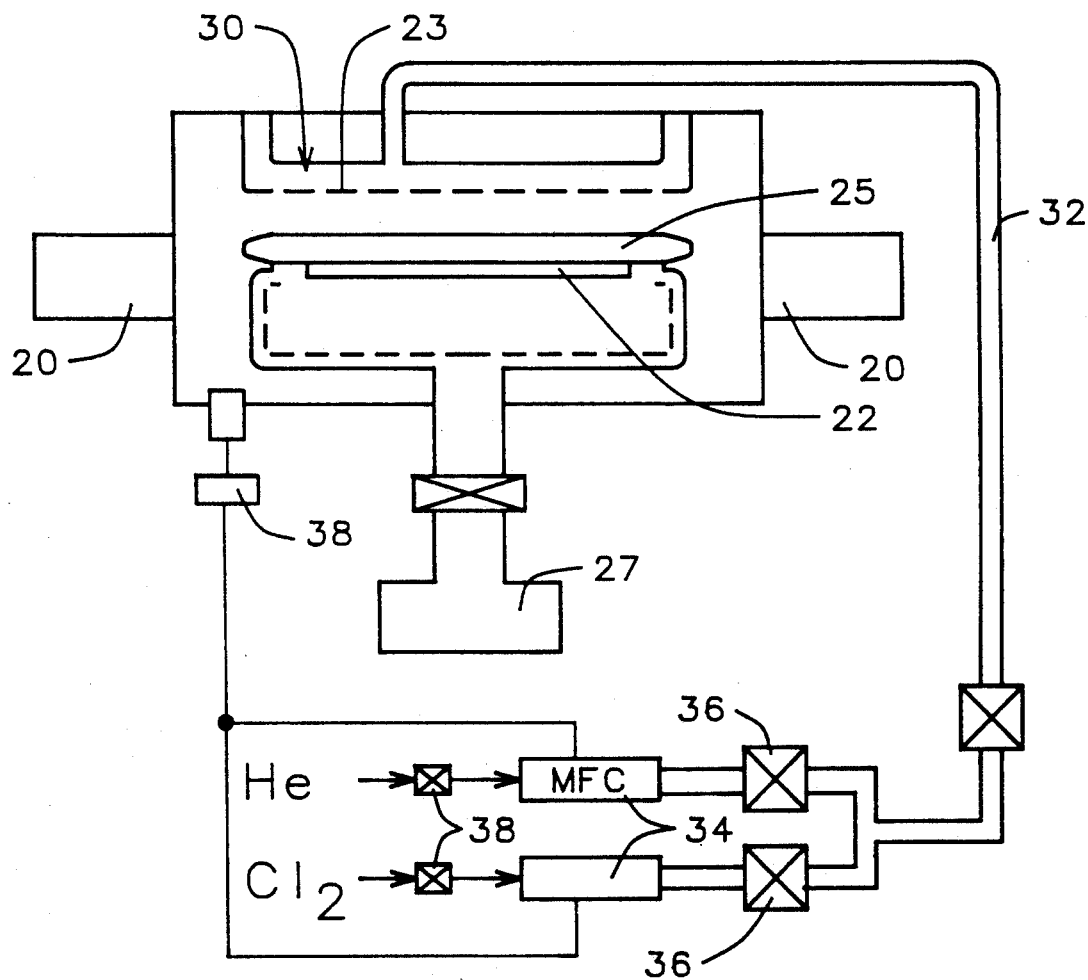
FIG. 5 schematically illustrates in cross-sectional representation a view of the vacuum chamber and gas flow control system.

Referring now to FIG. 5, there is shown a vacuum chamber. The wafer to be etched 25 is placed between the lower and upper electrodes, 22 and 23 respectively. The Load/Lock mechanisms 20 provide for automatic insertion and removal of the wafer. For the first process step, a vacuum of 5 mTorr is provided by the vacuum pump 27. The temperature inside the chamber is maintained at 120° C. during plasma-on operation of the process. The gap between the lower and upper electrodes 22 and 23 is preferably 0.5 cm. Chlorine and Helium gases flow into the chamber through the gas feed 32. Valves 36 turn the gas flow on and off. Valves 34 are the Mass Flow Controllers which are used to adjust the gas flow according to electronic signals from a computer. The flow rate for this first step is 150 sccm+/−30 of Helium and 80 sccm+/−20 of Chlorine. A suitable radio frequency with a power of about 275 watts is applied. The radio frequency generator source is not shown in the drawing. The radio frequency power from the generator is applied to the plasma etching equipment at 30. This first step lasts until the tungsten silicide is removed. The endpoint detector 38 is a photodiode which observes the light emitted during the etching process. When all the tungsten silicide in etched through, the light emission intensity drops, this information is passed to the computer and the computer tells the Mass Flow Controller to close the valves 36.

Figure 2:
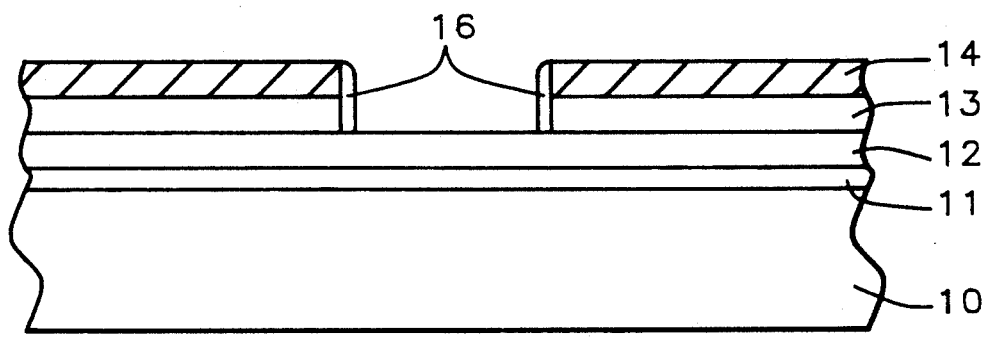

After the first process step is completed, the tungsten silicide layer 13 has been etched away, as shown in FIG. 2.

Figure 4:
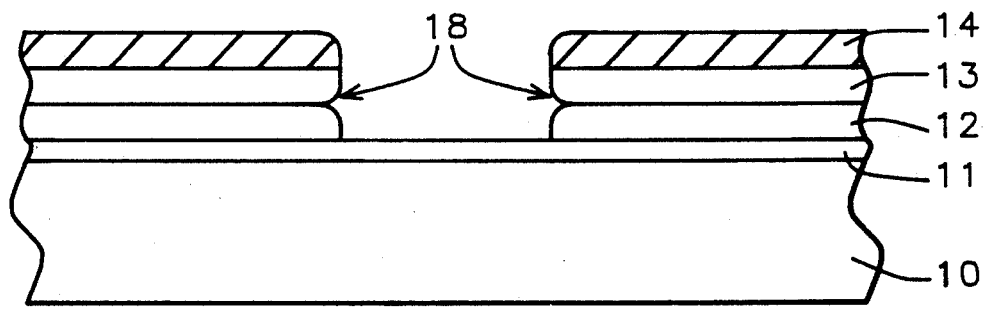
FIG. 4 schematically illustrates in cross-sectional representation one embodiment of the prior art.

The second process step is the helium purge. The chlorine gas is turned off and only the helium gas flows into the vacuum chamber. A vacuum pressure of 400 mTorr is provided during this step. No radio frequency is applied. A flow rate of 200–500 sccm of Helium gas is applied. The flow rate must be more than about 200 sccm to purge the unwanted gases. We do not fully understand the reason why the helium purge gives this beneficial result. However, we beleive that the helium purge has two beneficial effects. First, the wafer is cooled by the flow of the helium gas. A lower temperature promotes a greater sidewall film deposit. Although the plasma mode etch is an isotropic etch, the reaction of the chlorine gas with the photoresist produces a polymer which tends to deposit on the sidewalls of the etched opening resulting in an essentially anisotropic etch. It may be that the sidewall deposits, 16 shown in FIG. 2, act to protect the sidewalls from being undercut. The second benefit of the helium purge is the removal of byproducts which may tend to cause undercutting. This undercutting is illustrated by number 18 in FIG. 4.

Figure 3:
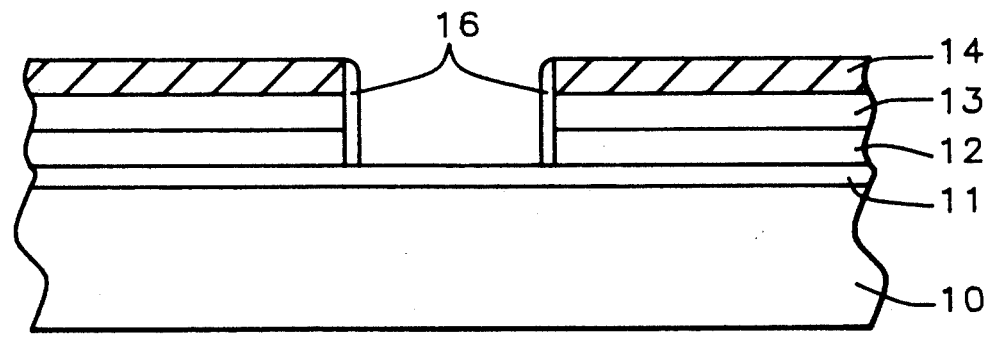

In the third step of the etching process, the chlorine gas is again turned on so that both chlorine and helium gases flow into the vacuum chamber. A vacuum pressure of 400 mTorr+/−50 is provided along with a radio frequency power of about 200 watts. A flow rate of 80 sccm+/−10 for both Helium and Chlorine gases is maintained. This application of the chlorine and helium gases acts to etch the final polysilicide layer resulting in contact with the silicon oxide layer 11 as illustrated in FIG. 3. The endpoint detector 38 again determines the end of this process step. With the process of this invention, no undercutting of the tungsten silicide area occurs.

The wafer 25 is removed from the etching apparatus. The photoresist layer 14 is removed by conventional resist stripping techniques, such as by oxygen dry ashing. Any sidewall deposites, such as layer 16 are removed using preferrably a sulfuric acid and hydrogen peroxide wet etchant.

While the invention has been particularly shown and described with reference to the preferred embodiments thereof, it will be understood by those skilled in the art that various changes in form and details may be made without departing from the spirit and scope of the invention.

What is claimed is:

1. The process of etching a metal silicide polysilicon multilayer gate on a semiconductor wafer through a patterned resist layer which will not undercut the metal silicide layer which process comprises:
   etching the said metal silicide layer with a first flow of chlorine and helium gases into a plasma reactive etching chamber operated in the isotropic mode containing said semiconductor wafer;
   detecting the endpoint of the completion of etching of said metal silicide and stopping the flow of said chlorine gas;
   flowing helium gas into said etch chamber to purge the chamber of all reaction product gases from said metal silicide etching; and
   etching said polysilicon layer with a second flow of chlorine and helium gases into said plasma etching chamber to thereby etch and pattern the polysilicon portion of said multilayer metal silicide polysilicon gate of said semiconductor wafer.

2. The process of claim 1 wherein said multilayer polysilicon gate consists of a layer of polysilicon underlying a layer of tungsten silicide.

3. The process of claim 1 wherein during said first flow of chlorine and helium gases the flow rate of the chlorine gas is between about 60 to 100 sccm and the flow rate of the helium gas is between about 120 to 180 sccm.

4. The process of claim 1 wherein during said flow of helium gas the flow rate of the helium gas is at least about 200 sccm.

5. The process of claim 1 wherein during said second flow of chlorine and helium gases the flow rate of the chlorine gas is between about 70 to 90 sccm and the flow rate of the helium gas is between about 70 to 90 sccm.

6. The process of claim 1 wherein during said first flow of chlorine and helium gases the radio frequency power applied is about 275 watts.

7. The process of claim 1 wherein during said flow of helium gas the radio frequency power is about 0 watts.

8. The process of claim 1 wherein during said second flow of chlorine and helium gases the radio frequency power is about 200 watts.

9. The process of claim 1 wherein said etch chamber is a vacuum chamber and the vacuum chamber during said first flow of chlorine and helium gases has a vacuum of about 5 mtorr and a temperature of about 120° C.

10. The process of claim 1 wherein the vacuum pressure is less than about 400 mTorr during said flow of helium gas purge.

11. The process of claim 1 wherein the vacuum pressure during said second flow of chlorine and helium gases is less than about 350 mTorr.

12. The process of etching a tungsten silicide polysilicon multilayer on a suitable substrate through a patterned resist layer which will not undercut the tungsten silicide layer which process comprises:
   anistropically etching the said tungsten silicide layer with a first flow of chlorine and helium gases into a plasma reactive etching chamber containing said substrate;
   detecting the endpoint of the completion of etching of said tungsten silicide and stopping the flow of said chlorine gas;
   flowing helium gas into said etch chamber for time sufficient to remove all reaction product gases from the said tungsten silicide etching; and
   etching said polysilicon layer with a second flow of chlorine and helium gases into said plasma etching chamber to thereby etch and pattern the polysilicon portion of said multilayer metal silicide polysilicon on said substrate.

13. The process of claim 12 wherein during said first flow of chlorine and helium gases the flow rate of the chlorine gas is between about 60 to 100 sccm and the flow rate of the helium gas is between about 120 to 180 sccm.

14. The process of claim 12 wherein during said flow of helium gas the flow rate of the helium gas is at least about 200 sccm.

15. The process of claim 12 wherein during said second flow of chlorine and helium gases the flow rate of the chlorine gas is between about 70 to 90 sccm and the flow rate of the helium gas is between about 70 to 90 sccm.

16. The method of claim 12 wherein said substrate is a silicon wafer and said multilayer tungsten silicide polysilicon is a gate structure for a metal oxide field effect transistor intregrated circuit.

17. The process of etching a tungsten silicide polysilicon multilayer on a suitable substrate through a patterned resist layer which will not undercut the tugnsten silicide layer which process comprises:
   anisotropically etching the said tungsten silicide layer with a first flow of chlorine and helium gases into a plasma reactive etching chamber containing said substrate;
   wherein during said first flow of chlorine and helium gases the flow rate of the chlorine gas is between about 60 to 100 sccm and the flow rate of the helium gas is between about 120 to 180 sccm, detecting the endpoint of the completion of etching of said tungsten silicide and stopping the flow of said chlorine gas;

flowing helium gas into said etch chamber for time sufficient to remove all reaction product gases from the and tungsten silicide etching;

wherein during said flow of said helium gas the flow rate of the helium gas is at least about 200 sccm; and etching said polysilicon layer with a second flow of chlorine and helium gases into said plasma etching chamber to thereby etch and pattern the polysilicon portion of said multilayer metal silicide polysilicon on said substrate;

wherein during said second flow of chlorine and helium gases the flow rate of the chlorine gas is between about 70 to 90 sccm and the flow rate of the helium gas is between about 70 to 90 sccm.

18. The method of claim 17 wherein said substrate is a silicon wafer and said multilayer tungsten silicide polysilicon is a gate structure for a metal oxide field effect transistor integrated circuit.

19. The process of claim 17 wherein said etch chamber is a vacuum chamber and the vacuum chamber during said first flow of chlorine and helium gases has a vacuum of about 5 mtorr; the vacuum pressure is less than about 400 mTorr during said flow of helium gas purge; the vacuum pressure during said second flow of chlorine and helium gases is less than about 350 mTorr.

* * * * *